United States Patent
Khor et al.

(10) Patent No.: US 11,114,367 B2
(45) Date of Patent: Sep. 7, 2021

(54) MOLDED INTEGRATED CIRCUIT PACKAGES AND METHODS OF FORMING THE SAME

(71) Applicant: Carsem (M) SDN. BHD., Perak Darul Ridzuan (MY)

(72) Inventors: Lily Khor, Ipoh (MY); Phuah Kian Keung, Ipoh (MY)

(73) Assignee: Carsem (M) SDN. BHD., Ipoh (MY)

( * ) Notice: Subject to any disclaimer, the term of this patent is extended or adjusted under 35 U.S.C. 154(b) by 51 days.

(21) Appl. No.: 16/566,813

(22) Filed: Sep. 10, 2019

(65) Prior Publication Data

US 2020/0219800 A1 Jul. 9, 2020

(30) Foreign Application Priority Data

Jan. 4, 2019 (MY) ............................... 2019000245

(51) Int. Cl.
| | |
|---|---|
| *H01L 23/495* | (2006.01) |
| *H01L 21/56* | (2006.01) |
| *H01L 23/498* | (2006.01) |
| *H01L 23/24* | (2006.01) |
| *H01L 23/00* | (2006.01) |

(52) U.S. Cl.
CPC ...... *H01L 23/49513* (2013.01); *H01L 21/565* (2013.01); *H01L 23/24* (2013.01); *H01L 23/49811* (2013.01); *H01L 24/02* (2013.01)

(58) Field of Classification Search
CPC ......... H01L 23/49513; H01L 23/49811; H01L 23/49586; H01L 23/49861
See application file for complete search history.

(56) References Cited

U.S. PATENT DOCUMENTS

| | | | |
|---|---|---|---|
| 2014/0374891 A1* | 12/2014 | Low ................... | H01L 23/4334 257/675 |
| 2015/0137279 A1* | 5/2015 | Tiu ........................ | H01L 23/315 257/415 |
| 2015/0200180 A1* | 7/2015 | Fam ...................... | G01L 9/0054 257/415 |
| 2017/0278763 A1* | 9/2017 | Li ........................... | H01L 24/83 |
| 2017/0288108 A1* | 10/2017 | Schumann ............. | H01L 33/56 |
| 2019/0206752 A1* | 7/2019 | Bautista, Jr. ........... | H01L 24/73 |
| 2020/0131030 A1* | 4/2020 | Ngion ................... | H01L 23/552 |
| 2020/0321286 A1* | 10/2020 | Hooper .................... | G01L 9/06 |

* cited by examiner

*Primary Examiner* — Phuc T Dang
(74) *Attorney, Agent, or Firm* — Kilpatrick Townsend & Stockton LLP

(57) ABSTRACT

A package is disclosed. The package includes a leadframe, and a first die, attached to the leadframe. The package also includes first bond wires, each attached to one of the first bond pads of the first die and to one of the leads of the leadframe, and a package body molded over each of a portion of the die pad of the leadframe, a portion of the leads of the leadframe, a first portion of the first die, and one or more of the first bond wires. The molded package body defines a cavity, and a second portion of the first die contacts neither of the die pad and the package body. The package also includes a second die having second bond pads, where the second die is attached to the first die. The package also includes second bond wires, each attached to the first and second die.

21 Claims, 9 Drawing Sheets

MOLDED INTEGRATED CIRCUIT PACKAGES AND METHODS OF FORMING THE SAME

CROSS-REFERENCES TO RELATED APPLICATIONS

This application claims priority to Malaysian Patent Application No. PI2019000245, filed Jan. 4, 2019, the entire contents of which are incorporated herein by reference for all purposes.

FIELD OF THE INVENTION

Embodiments described herein relate in general to integrated circuit (IC) packages and, more particularly, to leadframes with molded cavities for use in making IC packages and methods for forming molded IC packages.

BACKGROUND

Many IC packages used for sensor applications include sensitive devices such as photodiodes, microelectromechanical systems (MEMS), and the like. Because of their sensitivity, these devices are generally not encapsulated using conventional molding techniques. Instead, a pre-molded cavity is typically formed on a substrate (e.g., a leadframe, laminate substrate, ceramic substrate, or the like). The pre-molded cavity may be formed using an insert. The insert defines the cavity, and the molded portions form a wall or protective barrier surrounding the cavity. Portions of the leads and die pad are exposed in a center of the cavity. The devices can be coupled to the die pad and bonded to the leads within the cavity. They can then be covered with a protective gel encapsulant.

Conventional processes for forming IC packages with pre-molded cavities suffer from a number of quality issues. Thus, improvements are continuously sought to improve reliability of molded IC packages.

SUMMARY

Some embodiments described herein provide IC packages having improved reliability.

One inventive aspect is an IC package. The package includes a leadframe, having a die pad and a plurality of leads. The package also includes a first die having a plurality of first bond pads, where the first die is attached to the die pad of the leadframe. The package also includes a plurality of first bond wires, each attached to one of the first bond pads of the first die and to one of the leads of the leadframe, and a molded package body formed from a molding compound molded over each of a portion of the die pad of the leadframe, a portion of the leads of the leadframe, a first portion of the first die, and one or more of the first bond wires. The molded package body partially defines a cavity, and a second portion of the first die contacts neither of the die pad and the molded package body. The package also includes a second die having a plurality of second bond pads, where the second die is attached to the second portion of the first die in the cavity. The package also includes a plurality of second bond wires, each attached to one of the first bond pads of the first die and to one of the second bond pads of the second die.

Another inventive aspect is a method of forming one or more IC packages. The method includes providing a leadframe, including a die pad, and a plurality of leads, attaching a first die including a plurality of first bond pads to the die pad of the leadframe, and attaching each of a plurality of first bond wires to one of the first bond pads of the first die and to one of the leads of the leadframe. The method also includes forming a molded package body by molding a molding compound over each of a portion of the die pad of the leadframe, a portion of the leads of the leadframe, a first portion of the first die, and one or more of the first bond wires. The molded package body partially defines a cavity, and a second portion of the first die contacts neither of the die pad and the molded package body. The method also includes attaching a second die having a plurality of second bond pads to the second portion of the first die in the cavity, and attaching each of one or more second bond wires to one of the first bond pads of the first die and to one of the second bond pads of the second die.

DETAILED DESCRIPTION

Embodiments described herein can improve reliability of IC packages. For example, in an embodiment, a molding compound may be formed that encompasses each of many leadframes in a leadframe array for IC packages and a peripheral portion of many die each bonded to one of the leadframes of the array. The molding compound and each particular die may partially define a cavity for each particular die.

In another embodiment, after the molding compound is formed, a second die is attached and bonded to the first die. In some embodiments, one or more die are additionally attached.

In another embodiment, a panel lid having many lids is connected to the molding compound such that the die of each of the leadframes of the array is covered or partially covered by the panel lid which further defines the cavity of each die.

It should be appreciated that the IC packages shown in the figures and described below are used merely as examples and that the methods and structures described herein may be applied to a number of different types of semiconductor packages. These include any type of leadframe package such as quad-flat no-leads (QFN) packages, dual-flat no-leads (DFN) packages, micro leadframe packages (MLPs), and the like. Also, the various features shown in the figures are not intended to be drawn so scale, and certain features may be exaggerated in some instances to highlight particular aspects.

Figure 1:
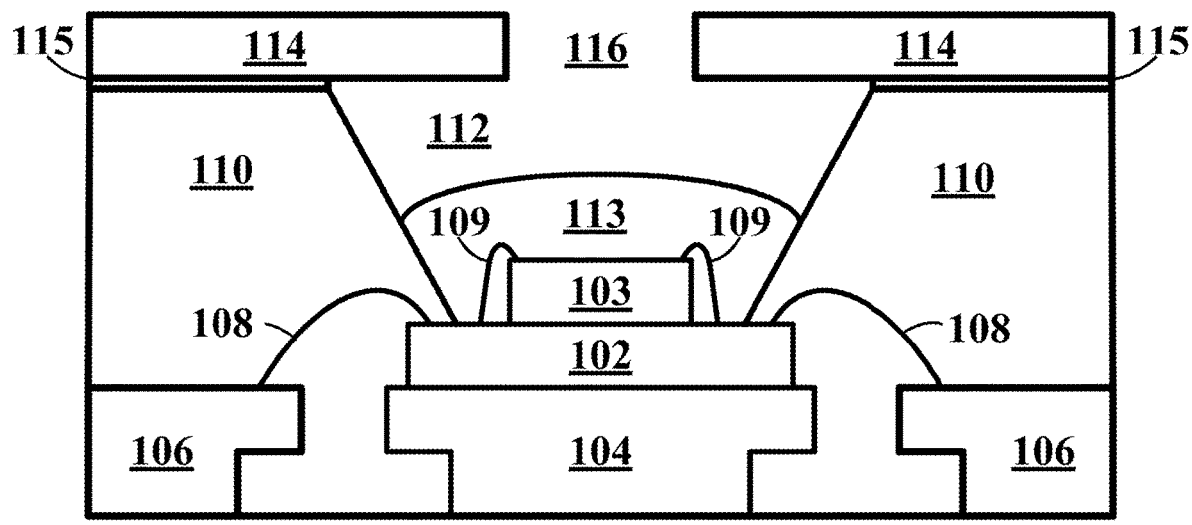
FIG. 1 is a schematic cross-sectional view of an IC package in accordance with an embodiment.

FIG. 1 is a simplified cross-sectional view of an IC package in accordance with an embodiment. Leads 106 and die pad 104 are mechanically connected and form part of a leadframe. A package body 110 comprising a molding compound extends over portions of leads 106 that are located farthest from die pad 104, over bond wires 108 electrically connecting semiconductor die 102 to leads 106, and over a portion of die 102. The molding compound may include a conventional injection mold compound such as a Fortron® PPS polymer manufactured by Celanese Corporation. The package body 110 forms a cavity 112 over the die 102. Other portions of the package body 110 fill spaces between the leads 106 and the die pad 104. The semiconductor die 102 is coupled to the die pad 104 (e.g., using an adhesive). Bond pads (not shown) on an upper surface of the semiconductor die 102 are bonded to the leads 106 using bonding wires 108 and are covered by package body 110. A second semiconductor die 103 is attached and wirebonded to die 102. A gel encapsulant 113 covers the semiconductor die 102 and 103, and fills at least a portion of the cavity 112 over the die 102 and 103. A lid 114 is bonded to package body 110 by adhesive 115. Bottom surfaces of the die pad 104 and leads 106 may be exposed along a bottom of the IC package, and edges of the leads 106 farthest from the die pad 104 may be exposed along sides of the IC package. Although not shown in this example, in some embodiments portions of the leads may extend outward from the sides of the IC package.

Figure 2A:
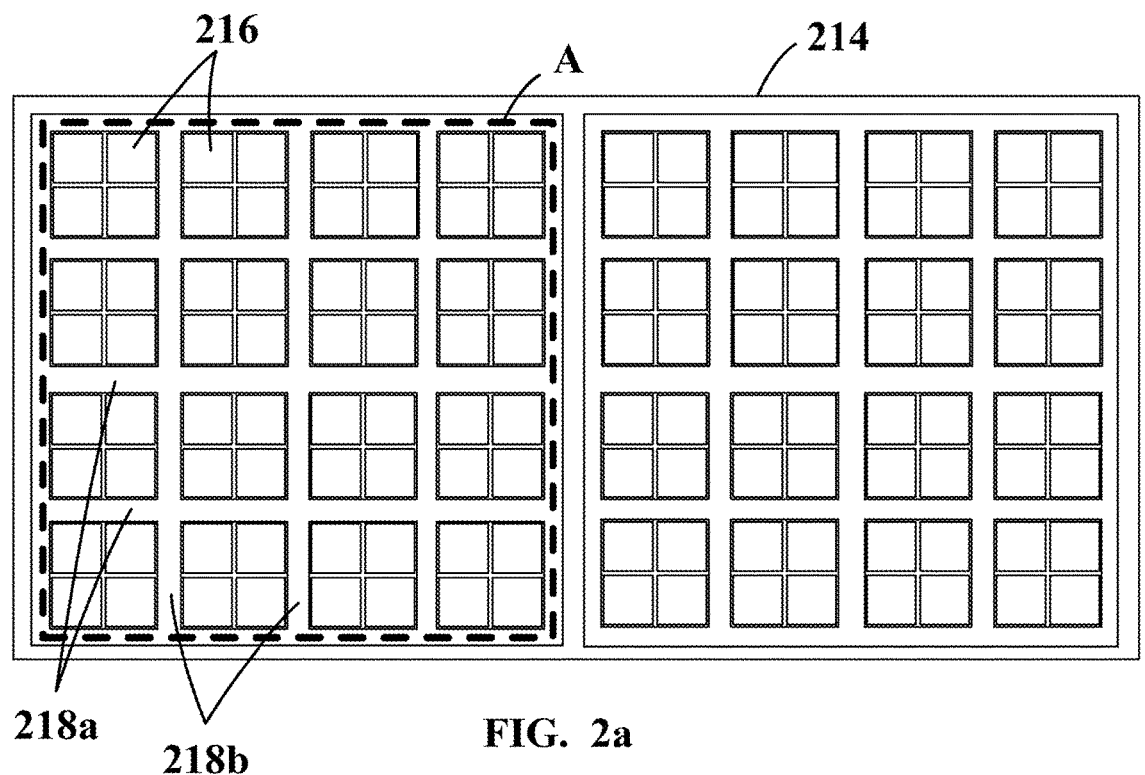
FIG. 2a-2c are simplified plan views of portions of a leadframe in accordance with some embodiments.

The IC package shown in FIG. 1 is typically one of many IC packages that are formed from a leadframe array which includes many leadframes such as that illustrated in FIG. 1 having leads 106 and die pad 104. A singulation (or sawing) process is used to separate the individual IC packages from the array of formed IC packages. An exemplary leadframe array (or portion of a leadframe) is shown in FIG. 2a. The leadframe array includes a plurality of leadframes 216 arranged in a pattern within an outer frame 214. In this example, the leadframes 216 are arranged in columns and rows, although some leadframe arrays may include a single row of leadframes 216 arranged side-by-side that are attached to the outer frame 214 at each end. The leadframe array also includes horizontal connecting bars 218a and vertical connecting bars 218b that separate adjacent leadframes 216. The leads and die pad of each unit (not shown in FIG. 2) are attached to the connecting bars 218a, 218b of the leadframe array. The connecting bars 218a, 218b are non-active regions of the leadframe array that support the individual leadframes and their die pads and leads during the IC package formation processes but are not typically part of the final IC packages.

In the illustrated embodiment, the panel A of the leadframe that is outlined by dashed lines in FIG. 2a includes 16 units 216. In alternative embodiments, panels may include other quantities of units. For example, in some embodiments, panels may include a 99 units, for example, arranged in a 9 by 11 matrix.

In the illustrated embodiment, the leadframe includes two panels A. In alternative embodiments, another quantity of panels may be included. For example, in some embodiments, a leadframe includes four panels, for example, arranged in a strip.

Figure 2B:
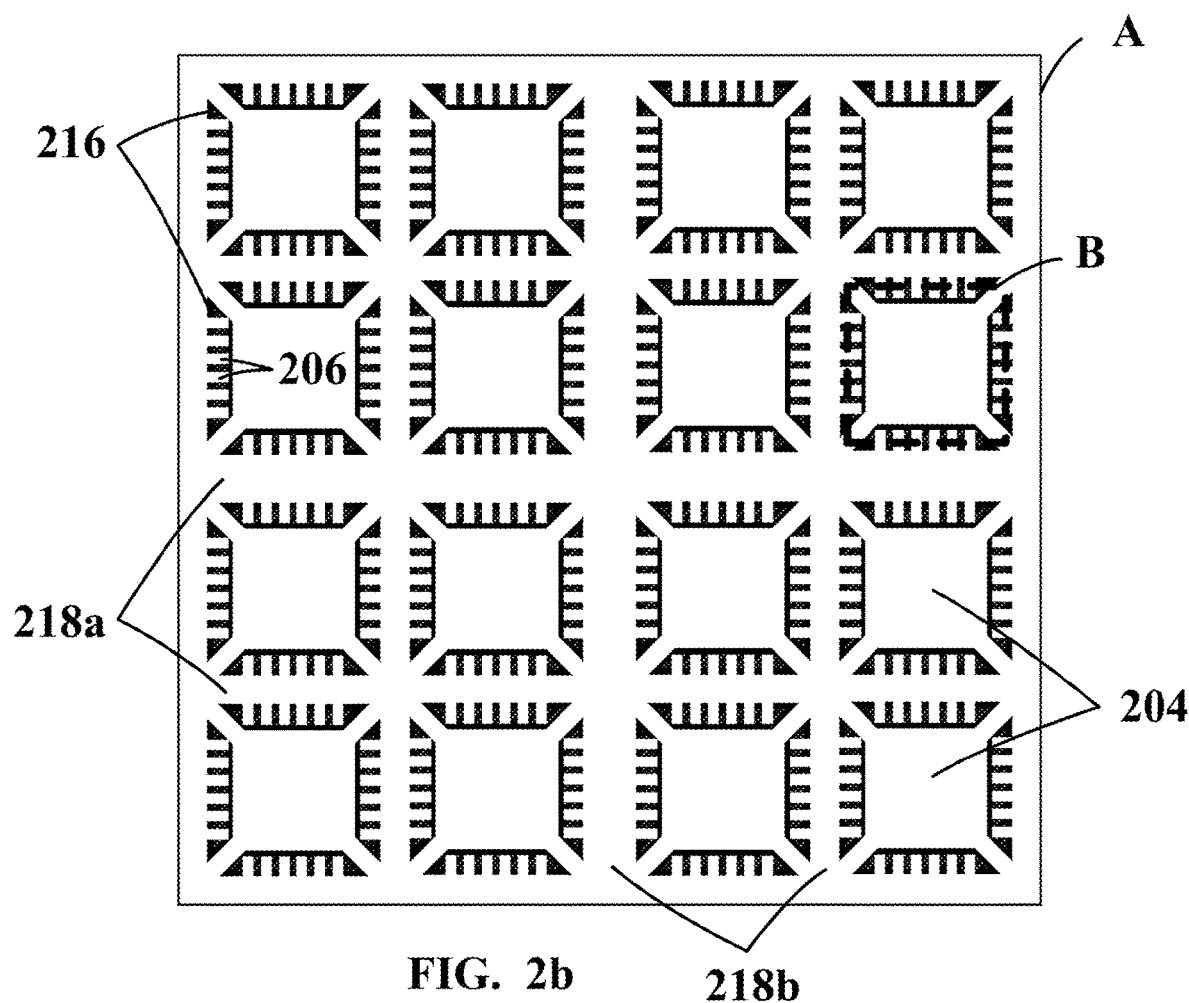

FIG. 2b is an enlarged view of the panel A of the leadframe array that is outlined by dashed lines in FIG. 2a. This enlarged view shows that each of the plurality of leadframes 216 include a die pad 204 near a center of each of the leadframes 216 and a plurality of leads 206 surrounding the die pad 204. This view also shows that the leads 206 and the die pad 204 of each leadframe are attached to the connecting bars 218a, 218b. Within each leadframe, the leads 206 extend outward from the connecting bars 218a, 218b toward the die pad 204. In this embodiment, die pad 204 is attached to the connecting bars 218a, 218b by tie bars that extend from each corner of the die pad 204.

Figure 2C:
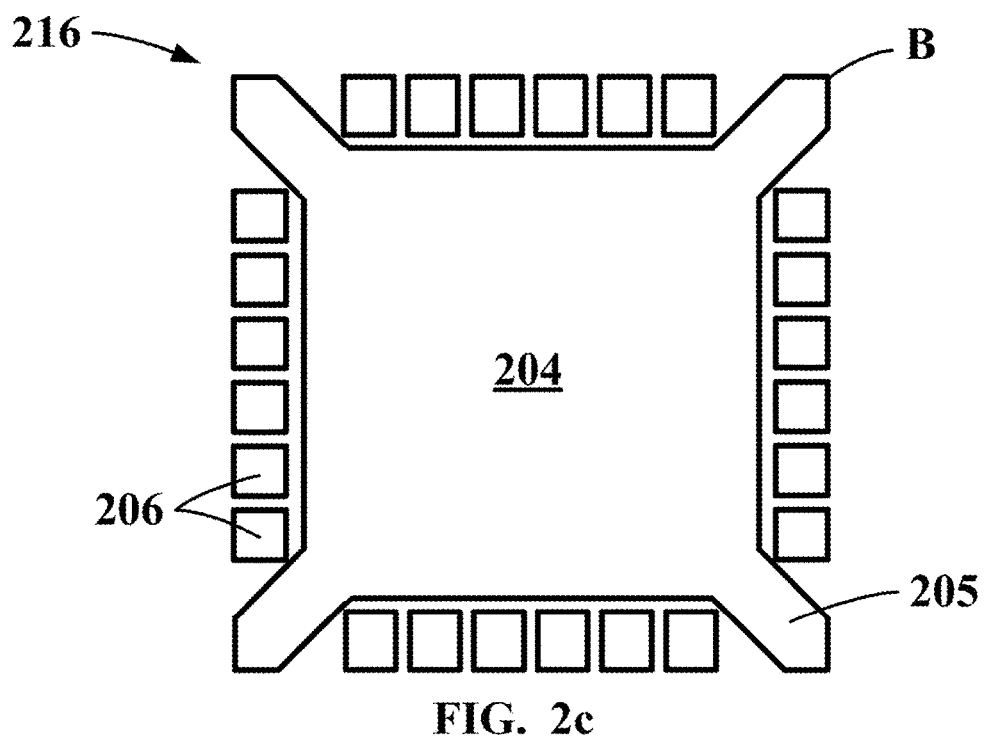

FIG. 2c is an enlarged view of a single one of the leadframes of the leadframe array. This is an enlarged view of a single leadframe 216 and shows a die pad 204 surrounded by leads 206. The tie bars 205 are more clearly shown in this figure as well.

FIGS. 2a-2c show portions of an exemplary leadframe array. Embodiments described herein are not limited to any particular leadframe structure. Embodiments may be used with leadframe arrays that include any number and arrangement of leadframes 216, leads 206, die pads 204, tie bars, connecting bars 218a, 218b, and/or other structures or features. In some embodiments, the leadframe does not include dimples.

FIGS. 3A-3J are schematic views illustrating an IC package at various stages of a method of a forming the IC package in accordance with an embodiment.

Figure 3A:
FIGS. 3A-3J are schematic views illustrating an IC package at various stages of a method of a forming the IC package in accordance with an embodiment.

In FIG. 3A, a die pad 304 and leads 306 of a single leadframe are illustrated. Spaces separate the die pad 304 from the leads 306. Edges of the die pad 304 and the leads 306 include a step-shaped profile in this example. This profile is used to improve adhesion with encapsulant materials (e.g., molding compounds) that may be added during the assembly process. The step-shaped profile may extend along each side of the die pad 304 and one or more sides of the leads 306. This step-shaped profile is illustrated merely as an example, and embodiments described herein are not limited to any particular shape (including a straight edge on the die pad 304 and/or leads 306).

The leadframe array may be, for example, a laminate substrate or a ceramic substrate.

Although not shown in this figure, the die pad 304 and leads 306 are typically part of a leadframe array that includes a number of similar leadframes, each having a die pad and leads. The leadframe array may be supported by an adhesive tape or ring (not shown) during at least some of the assembly process steps.

Figure 3B:
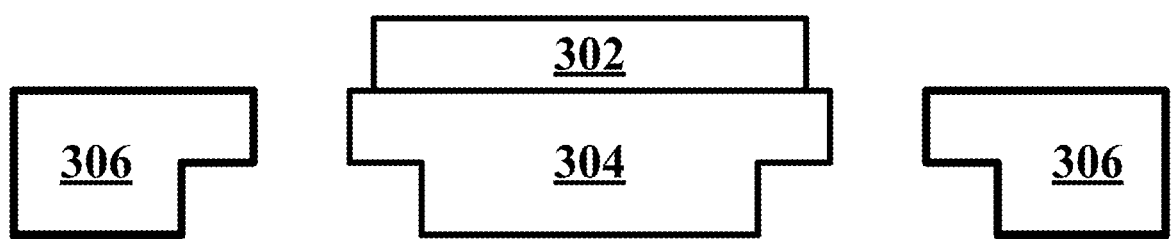

In FIG. 3B, a first semiconductor die 302 attached to die pad 304 is additionally illustrated. The first semiconductor die 302 may be attached to the die pad 304 using, for example, a conventional die attach adhesive.

Other semiconductor die are similarly attached to the die pads of the other leadframes of the leadframe array. In some embodiments, the other semiconductor die are attached to the other die pads of the other leadframes of the leadframe array before the packaging process steps discussed with reference to FIGS. 3C-3J are performed, for example, as part of a semiconductor die attach process step, during which semiconductor die are attached to each of the die pads of the leadframes of the leadframe array.

Figure 3C:
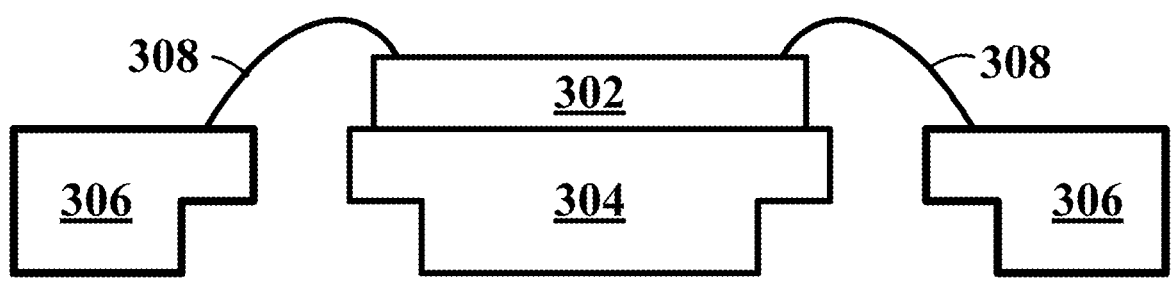

In FIG. 3C, bonding wires 308 are additionally illustrated. Bonding wires 308 electrically connect bond pads (not shown) on the top surface of the first semiconductor die 302 and to the leads 306. Bonding wires 308 may be attached to the bond pads of first semiconductor die 302 and to the leads 306 with, for example, a conventional wire bonding process using, for example, standard bonding wire materials.

Other semiconductor bonding wires are similarly attached to the die and leads of the other leadframes of the leadframe array. In some embodiments, the semiconductor bonding wires are attached to the die and leads of the other leadframes of the leadframe array before the packaging process steps discussed with reference to FIGS. 3D-3J are performed, for example, as part of a wire bonding process step, during which each of the die are bonded to the leads of the leadframe to which they are attached.

Figure 3D:
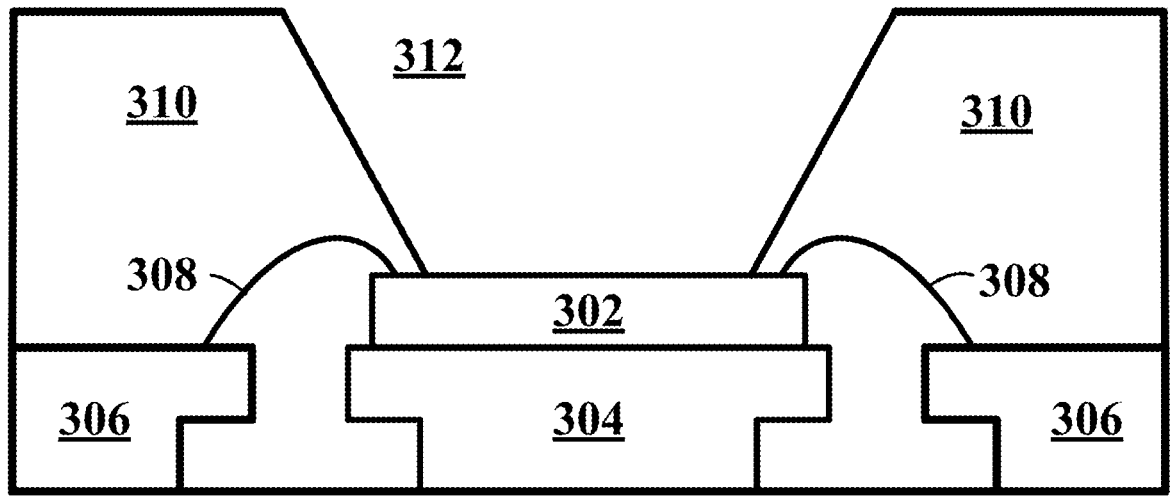

In FIG. 3D, semiconductor package body 310 is additionally illustrated. Semiconductor package body 310 is formed with, for example, a molding compound. For example, a standard transfer molding or other molding process may be used to form semiconductor package body 310. As shown, during the molding process, the molding compound fills the spaces separating the die pad 304 and the leads 306.

In addition, as shown, package body 310 encapsulates a peripheral portion of first semiconductor die 302, the bond pads of semiconductor die 302 connected to bond wires 308, and the bond wires 308. In addition, package body 310 partially encapsulates leads 306, and partially defines cavity 312 above die 302.

Other semiconductor package bodies are similarly formed using the molding compound, where the other semiconductor package bodies are each formed so as to similarly encapsulate a peripheral portion of the semiconductor die, the bond pads, and the bond wires of one of the other leadframes of the leadframe array. In some embodiments, the other semiconductor package bodies are formed before the packaging process steps discussed with reference to FIGS. 3E-3J are performed, for example, as part of a molding process step, during which semiconductor package bodies are formed for each of the leadframes of the leadframe array.

Figure 3E:
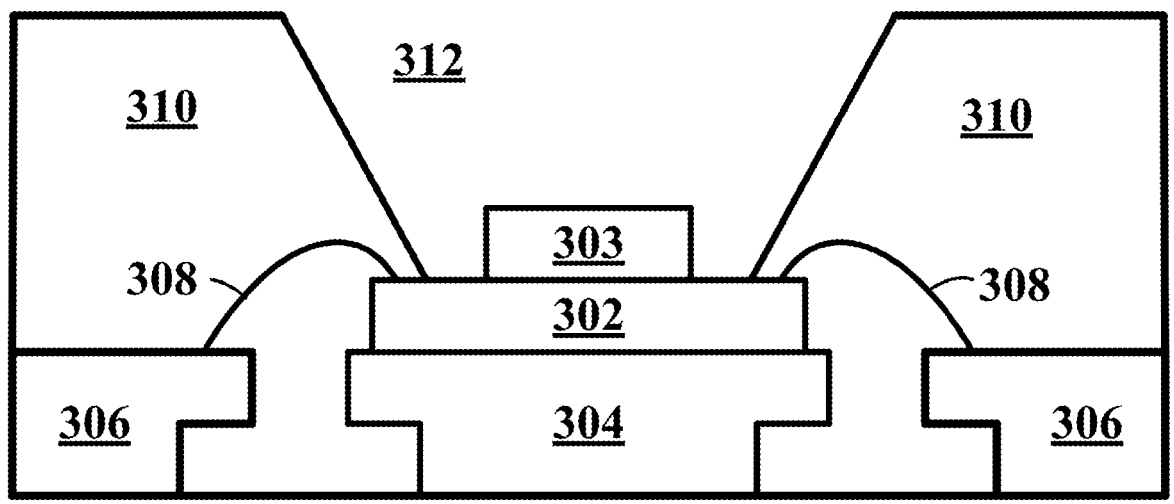

In FIG. 3E, a second semiconductor die 303 attached to first semiconductor die 302 is additionally illustrated. The second semiconductor die 303 may be placed into cavity 312 and attached to first semiconductor die 302 using, for example, a conventional die to die attaching process.

Other second semiconductor die may be similarly attached to the first semiconductor die of the other leadframes of the leadframe array. In some embodiments, the other second semiconductor die are attached to the other first semiconductor die of the other leadframes of the leadframe array before the packaging process steps discussed with reference to FIGS. 3F-3J are performed, for example, as part of a semiconductor die to die attaching process step, during which second semiconductor die are attached to each of the first semiconductor die of the leadframes of the leadframe array.

Figure 3F:
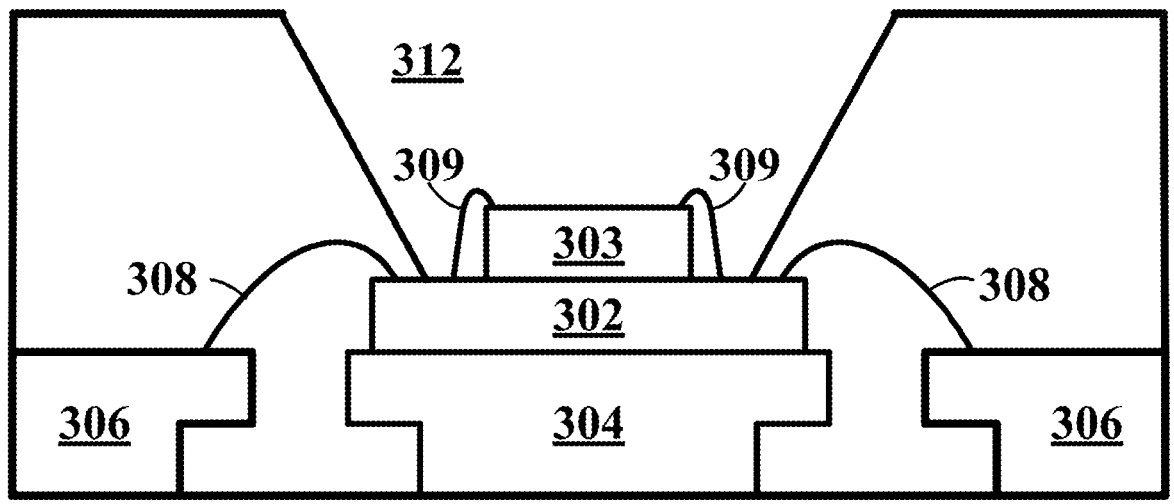

In FIG. 3F, bonding wires 309 are additionally illustrated. Bonding wires 309 electrically connect bond pads (not shown) on the top surface of the second semiconductor die 303 and to the bond pads on the top surface of the first semiconductor die 302. Within cavity 312, bonding wires 309 may be attached to the bond pads of second semiconductor die 303 and to the bond pads of first semiconductor die 302 with, for example, a conventional wirebonding process using, for example, standard bonding wire materials.

Other semiconductor bonding wires are similarly attached to the first and second die of the other leadframes of the leadframe array. In some embodiments, the other semiconductor bonding wires are attached to the first and second die of the other leadframes of the leadframe array before the packaging process steps discussed with reference to FIGS. 3G-3J are performed, for example, as part of a wirebonding process step, during which each of the first and second die are bonded to one another.

In some embodiments, one or more additional die may be attached to second semiconductor die 303. Each of the additional die may be wirebonded to either or both of the first and second semiconductor die 302 and 303.

In some embodiments, the depth of cavity 312 corresponds with the number of die stacked on first semiconductor die 302. For example, the depth of cavity 312 for a package to be occupied by no die stacked on first semiconductor die 302 would be less than the depth of cavity 312 for a package to be occupied by one, two, three, or more die stacked on first semiconductor die 302.

Figure 3G:
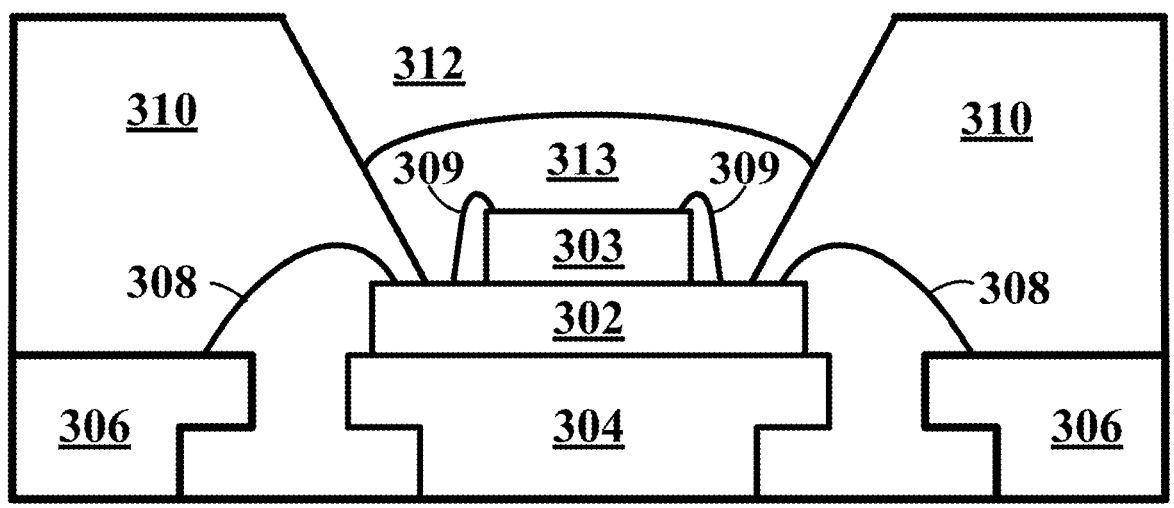

In FIG. 3G, gel encapsulant 313 is additionally illustrated. Gel encapsulant 313 covers second semiconductor die 303 and bond wires 309 in cavity 312, and forms a protective or passivation layer. The gel encapsulant may include a conventional encapsulant, such as a HIPEC® protective coating manufactured by Dow Corning Corporation. In the illustrated embodiment gel encapsulant 313 partially fills cavity 312. In alternative embodiments, a gel encapsulant 313 entirely fills cavity 312.

Other gel encapsulants are similarly placed in the cavities of the other leadframes of the leadframe array to cover the second semiconductor die and bond wires of the other leadframes of the leadframe array. In some embodiments, the other gel encapsulants are similarly placed in the cavities of the other leadframes of the leadframe array before the packaging process steps discussed with reference to FIGS. 3H-3J are performed, for example, as part of a passivation process step, during which each of the cavities of the leadframes of the leadframe array are filled at least enough gel encapsulant to cover any exposed semiconductor die and any exposed bond wires.

Figure 3H:
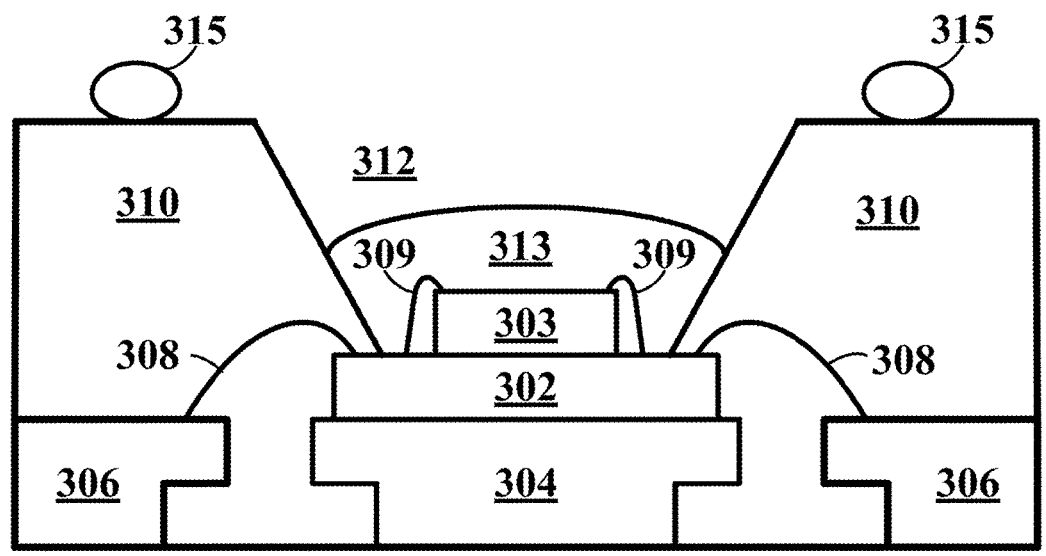

In FIG. 3H, an adhesive 315 is additionally illustrated. Adhesive 315 may include or be an epoxy-based adhesive. Using processing techniques known of those to those of skill in the art, the adhesive 315 is extruded or otherwise placed on package body 310. In some embodiments, the surface of package body 310 onto which adhesive 315 is placed has a matte finish to improve adhesion between package body 310 and adhesive 315.

Other adhesives may similarly placed on the package bodies of the other leadframes of the leadframe array. In some embodiments, the other adhesives are similarly placed on the package bodies of the other leadframes of the leadframe array before the packaging process steps discussed with reference to FIGS. 3I and 3J are performed, for example, as part of an adhesive extrusion process step, during which each of the adhesives are placed on the package bodies of the leadframes of the leadframe array.

Figure 3I:
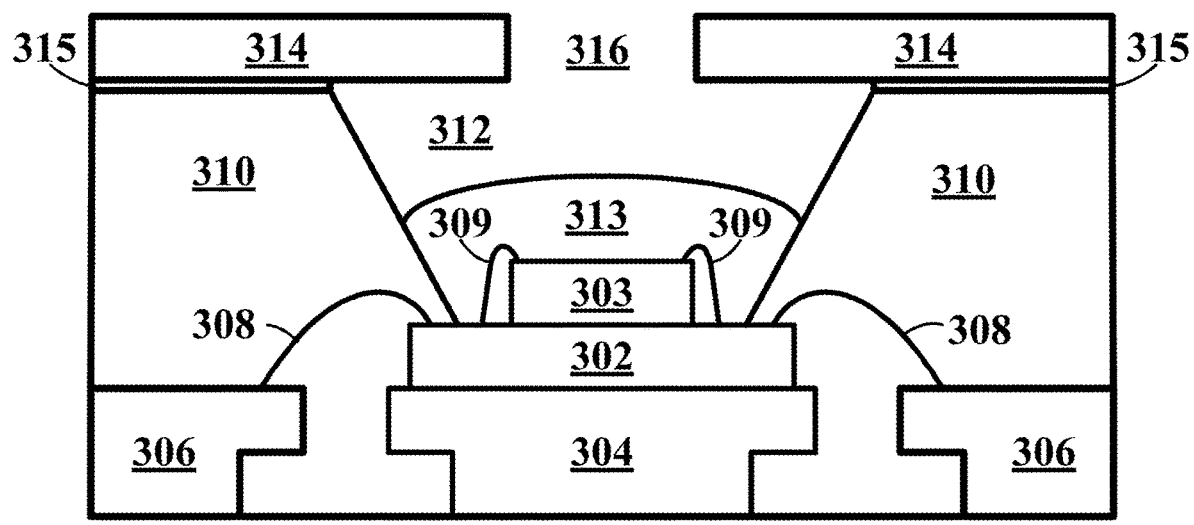
Figure 3J:
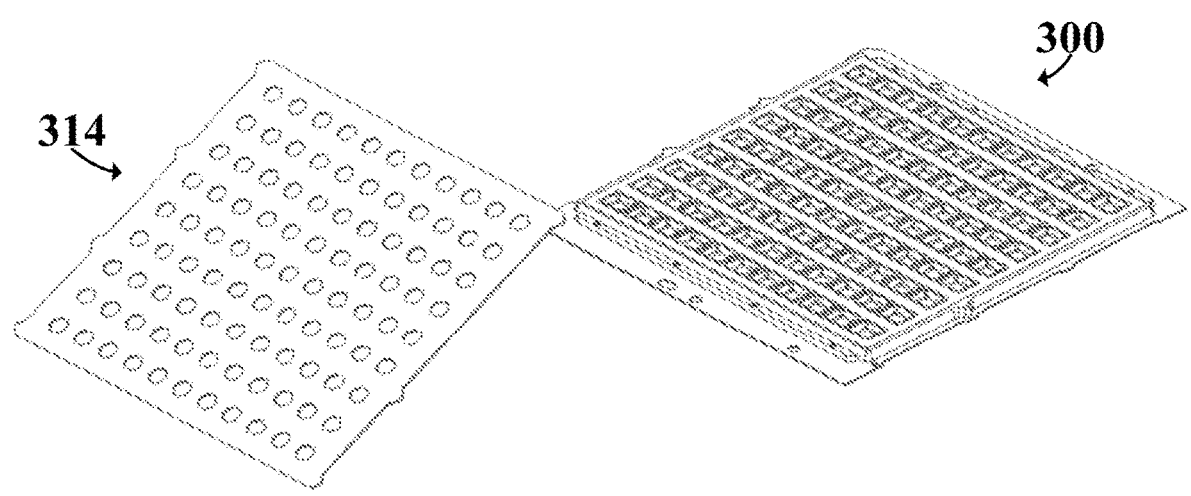

In FIG. 3I, a lid 314 is additionally illustrated. Lid 314 may be formed of a molding compound. In some embodiments, lid 314 comprises a molding compound which similar or identical to the molding compound used to form package body 310. Using a molding compound which is similar or identical to the molding compound used to form package body 310 is advantageous at least because the package body and the lid have the same coefficient of thermal expansion. This results in reduced stress between the package body and the lid during temperature excursions. In other embodiments, lid 314 may comprise a different material than the molding compound used to form package body 310.

Using processing techniques known of those to those of skill in the art, the lid 314 is placed on package body 310, such that adhesive 315 adheres to both package body 310 and to lid 314, or such that lid 314 is adhered to package body 310 by adhesive 315. In some embodiments, after the lid 314 is adhered to package body 314, adhesive 314 is cured in an oven to improve adhesion. In some embodiments, the surface of lid 314 which contacts adhesive 315 has a matte finish to improve adhesion between lid 314 and adhesive 315.

Other lids are similarly placed on the package bodies of the other leadframes of the leadframe array. In some embodiments, the lids of the leadframes of the leadframe array are part of an integrated lid array. For example, FIG.

3J illustrates a lid array 314 for leadframe array 300. Leadframe array 300 has been processed as described above with reference to FIGS. 3A-3H. Accordingly, each of the leadframes of leadframe array 300 has first and second semiconductor die, bond wires, a gel encapsulant, a package body, and adhesive, similar to those described above with reference to FIGS. 3A-3H.

After the adhesives are placed on each of the package bodies of leadframe array 300, lid array 314 is placed on leadframe array 300, such that the adhesives bind lid array 314 to the package bodies of leadframe array 300. In some embodiments, the adhesives completely surround each of the cavities defined by the package bodies.

In this embodiment, each of the lids of the lid array has a hole. In addition, the lids of the lid array 314 are arranged such that when the lid array 314 is adhered to the leadframe array 300, the hole of each particular lid exposes the cavity defined by the package body to which that particular lid is adhered. In alternative embodiments the lids of the lid array each have multiple holes. In some embodiments, the lids of the lid array each have transparent portions. In some embodiments, the size of the hole corresponds with the size of the cavity. In some embodiments, the holes of some lids are larger than the holes of other lids.

After the lid array 314 is attached to frame array 300, individual packages are formed using a singulating process known to those of skill in the art. For example, a saw blade may be used to cut through the connecting bars between adjacent leadframes of the leadframe array (exposing the leads), through the molding material joining packaging bodies of adjacent leadframes of the leadframe array, and through the molding material joining lids of adjacent leadframes of the leadframe array. One beneficial aspect of this process is that the edges of the leads, the edges of the packaging body, and the edges of the lid, of each singulated package are aligned. Other methods for singulating individual packages may alternatively be used.

Figure 4:
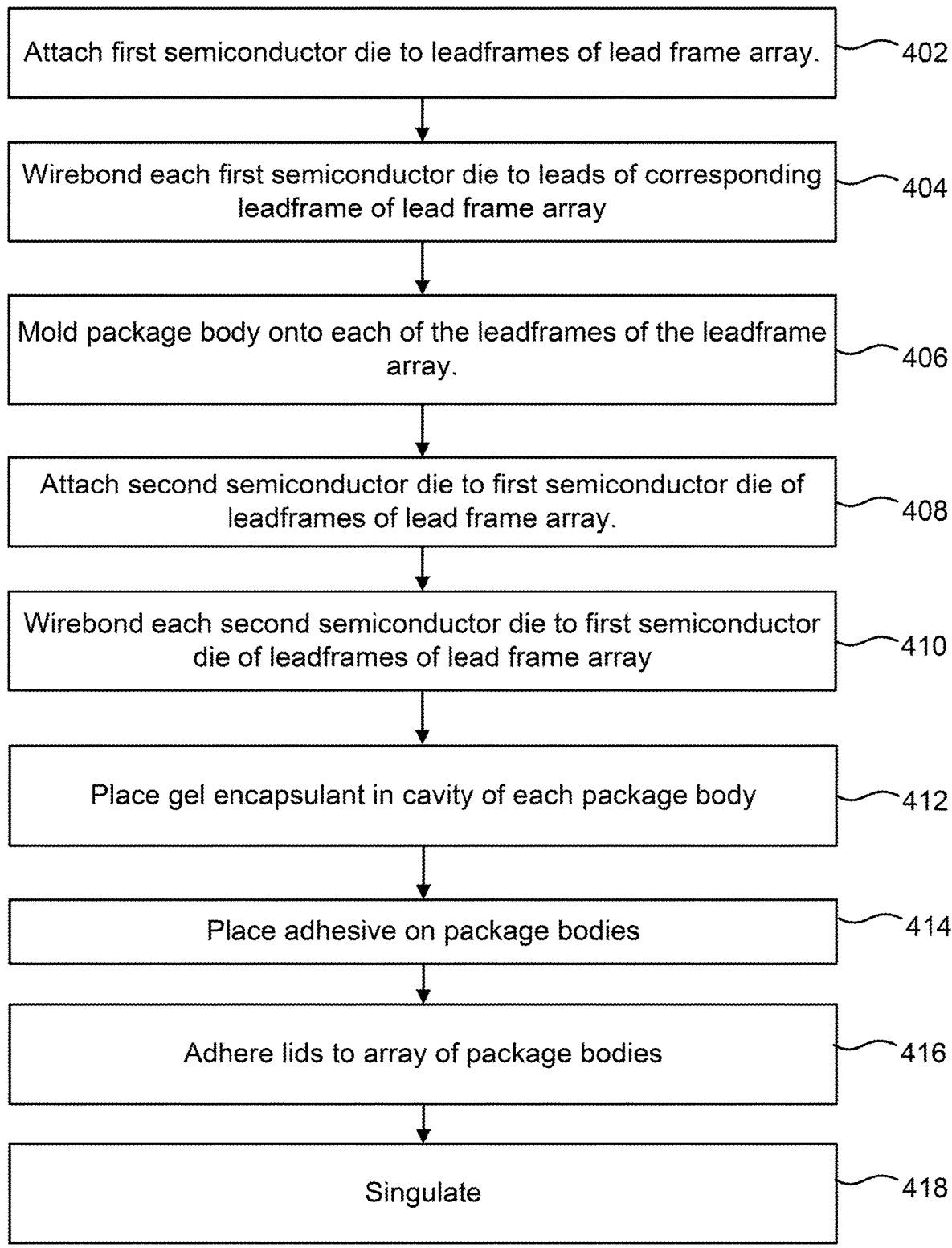
FIG. 4 is a flowchart diagram illustrating a method of forming a plurality of IC packages.

FIG. 4 is a flowchart diagram illustrating a method of forming a plurality of IC packages.

At 402, a plurality of first semiconductor die, such as semiconductor die 302 are attached to die pads, such as die pad 304 of leadframes of a leadframe array.

At 404, the first semiconductor die are wirebonded to leads, such as leads 306, of corresponding leadframes of the leadframe array.

At 406, a package body, such as package body 310, is molded on each of the leadframes of the leadframe array.

At 408, a plurality of second semiconductor die, such as semiconductor die 303 are attached to first semiconductor die, such as semiconductor die 302 of the leadframes of the leadframe array. In some embodiments, one or more additional die are attached to either the first semiconductor die or another previously attached semiconductor die.

At 410, the second semiconductor die are wirebonded to the first semiconductor die of the corresponding leadframes of the leadframe array. In some embodiments, one or more additional die are wire bonded to either or both of the first semiconductor die and another previously attached semiconductor die.

At 412, a gel encapsulant, such as gel encapsulant 313, is placed in each of the cavities of the leadframes of the leadframe array.

At 414, an adhesive, such as adhesive 315, is placed on each of the package bodies of the leadframes of the leadframe array.

At 416, a lid array is adhered to the package bodies of the leadframes of the leadframe array.

At 418, individual packages are isolated by singulating the individual packages.

It should be appreciated that the specific steps illustrated in FIG. 4 provide a particular method of forming IC packages in accordance with an embodiment. Other sequences of steps may also be performed according to alternative embodiments. For example, the steps outlined above may be performed in a different order. Moreover, the individual steps illustrated in FIG. 4 may include multiple sub-steps that may be performed in various sequences as appropriate. Furthermore, additional steps may be added or removed depending on the particular application.

Figure 5:
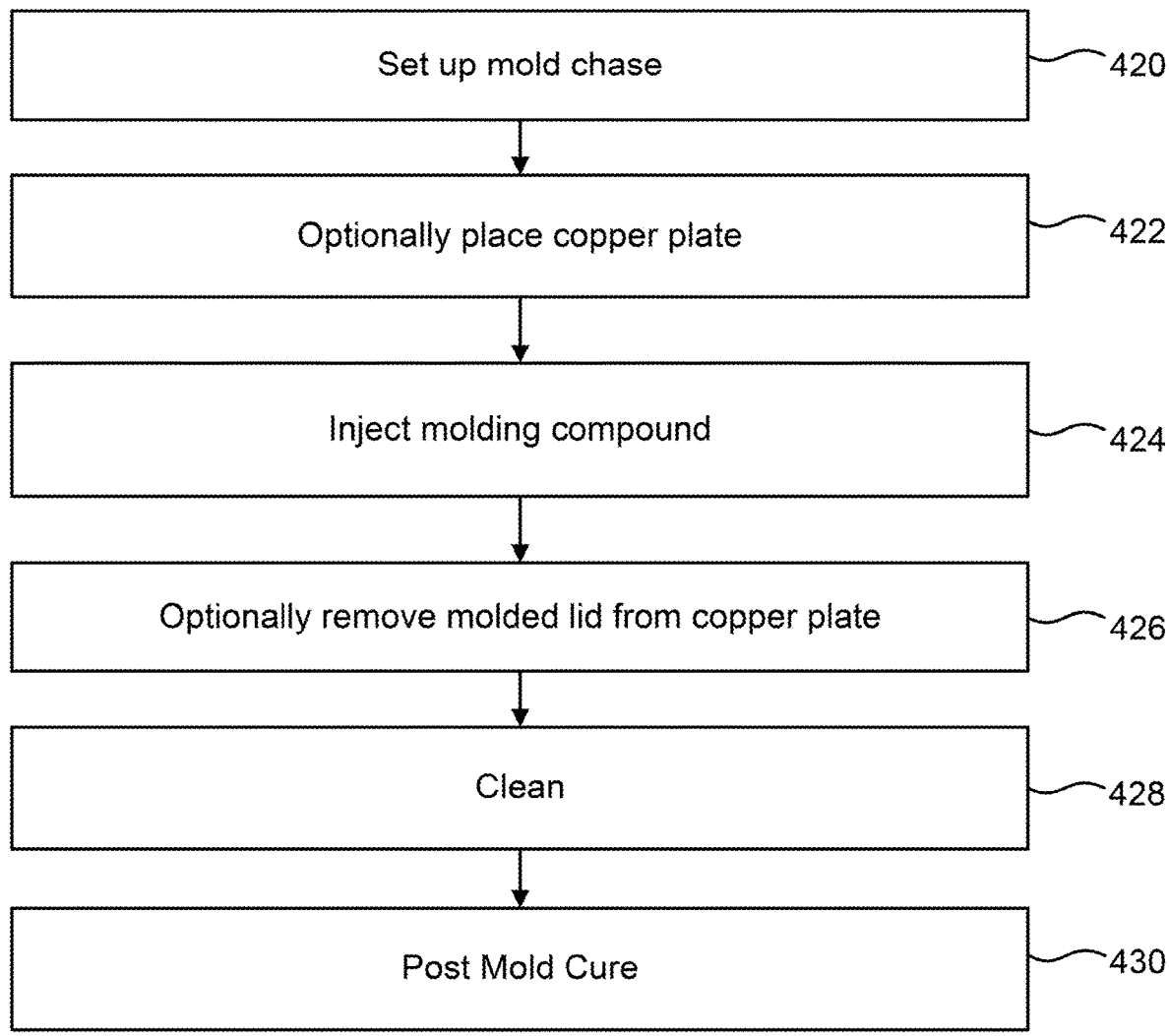
FIG. 5 is a flowchart diagram illustrating a method of forming a lid array for the plurality of IC packages.

FIG. 5 is a flowchart diagram illustrating a method of forming a lid array for the plurality of IC packages.

At 420, a mold chase is prepared. In some embodiments, the top mold chase is configured to apply a vacuum or low pressure to the mold cavity. Mold chase may, for example, be prepared by causing the temperature to be equal to a particular value, such as 175+/−5° C. Visual and or x-ray monitoring may be used, for example, to verify accurate positioning. Other preparation steps may be performed, as understood by those of skill in the art.

At optional 422, prior to the molding compound being injected into the chase, a plate, such as a copper plate is placed on the bottom portion of the chase.

At 424, a molding compound is injected into the chase and the lid array is formed, for example, using a process understood by those of skill in the art. In embodiments using a plate, the lid array is formed on the plate. Once formed and cooled, the lid array is removed from the chase. In embodiments using a plate, the lid array is attached to the plate when removed, such that the plate and the lid array are removed together.

At optional 426, the molded lid array is removed from the plate. The molded lid array may be removed from the plate by hand, automatically with a mechanized machine, with a tool, or by some other way, for example, as known to those skilled in the art.

At 428, the molded lid array is cleaned. For example, one or more surfaces may be cleaned by rubbing the surfaces with a microfiber wipe. For example, in embodiments using a plate, the surface contacting the plate may be rubbed with a microfiber wipe. Other cleaning methods, such as those known to those of skill in the art, may additionally or alternatively be used.

At 430, a post mold cure (PMC) process is performed. For example, the lid array may be loaded onto a PMC jig. In some embodiments, the lid array may be loaded onto the PMC jig with a number of other previously molded lid arrays. For example, a PMC jig may hold for separate stacks of 10 lid arrays each. In some embodiments, a number of PMC jigs, each holding a number of molded arrays, are vertically stacked. In some embodiments, the PMC process is performed controlled environmental conditions, such as humidity and temperature. The PMC process may be performed using aspects known to those of skill in the art.

In some embodiments, after the PMC process is performed, the lid arrays may be inspected, packaged, and stored.

It should be noted that some embodiments of the present invention may be implemented by hardware, software, firmware, middleware, microcode, hardware description languages, or any combination thereof. When implemented in software, firmware, middleware, or microcode, the program code or code segments to perform the necessary tasks may be stored in a computer-readable medium such as a storage medium. Processors may be adapted to perform the necessary tasks. The term "computer-readable medium" includes, but is not limited to, portable or fixed storage devices, optical storage devices, sim cards, other smart cards, and various other mediums capable of storing, containing, or carrying instructions or data.

While the present invention has been described in terms of specific embodiments, it should be apparent to those skilled in the art that the scope of the present invention is not limited to the embodiments described herein. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description but with reference to the appended claims along with their full scope of equivalents.

What is claimed is:

1. An IC package, comprising:
a first leadframe, comprising:
a first die pad, and
a plurality of first leads;
a first die comprising a plurality of first bond pads, wherein the first die is attached to the first die pad of the first leadframe;
a plurality of first bond wires, each attached to one of the first bond pads of the first die and to one of the first leads of the first leadframe;
a first molded package body formed from a molding compound molded over each of:
a portion of the first die pad of the first leadframe,
a portion of the first leads of the first leadframe,
a first portion of the first die, and
one or more of the first bond wires,
wherein the first molded package body partially defines a first cavity, and wherein a second portion of the first die contacts neither of the first die pad and the first molded package body;
a second die comprising a plurality of second bond pads, wherein the second die is attached to the second portion of the first die in the first cavity; and
a plurality of second bond wires, each attached to one of the first bond pads of the first die and to one of the second bond pads of the second die; and
a second leadframe, comprising:
a second die pad, and
a plurality of second leads;
a third die, comprising a plurality of third bond pads, wherein the third die is attached to the second die pad of the second leadframe;
a plurality of third bond wires, each attached to one of the third bond pads of the third die and to one of the second leads of the second leadframe;
a second molded package body formed from the molding compound molded over each of:
a portion of the second die pad of the second leadframe,
a portion of the second leads of the second leadframe,
a first portion of the third die, and
one or more of the third bond wires,
wherein the second molded package body partially defines a second cavity for the third die, and wherein a second portion of the third die contacts neither of the second die pad and the second molded package body;
a fourth die, comprising a plurality of fourth bond pads, wherein the fourth die is attached to the second portion of the third die; and
a plurality of fourth bond wires, each attached to one of the third bond pads of the third die and to one of the fourth bond pads of the fourth die.

2. The IC package of claim 1, further comprising a gel encapsulant, contacting the first die, the second die, and the second bond wires, wherein the gel encapsulant at least partially fills the first cavity.

3. The IC package of claim 1, further comprising a lid attached to the first molded package body, wherein the lid further defines the first cavity.

4. The IC package of claim 3, wherein the material forming the molding compound is the same as the material forming the lid.

5. The IC package of claim 3, wherein the lid comprises a hole exposing the first cavity.

6. The IC package of claim 3,
wherein the lid further defines the second cavity.

7. The IC package of claim 1, wherein the first molded package body is molded over each of the first bond wires.

8. The IC package of claim 1, wherein the first and second leadframes are attached.

9. A method of forming one or more IC packages, the method comprising:
providing a first leadframe, comprising:
a first die pad, and
a plurality of first leads;
attaching a first die comprising a plurality of first bond pads to the first die pad of the first leadframe;
attaching each of a plurality of first bond wires to one of the first bond pads of the first die and to one of the first leads of the first leadframe;
forming a first molded package body by molding a molding compound over each of:
a portion of the first die pad of the first leadframe,
a portion of the first leads of the first leadframe,
a first portion of the first die, and
one or more of the first bond wires,
wherein the first molded package body partially defines a first cavity, and
wherein a second portion of the first die contacts neither of the first die pad and
the first molded package body;
attaching a second die comprising a plurality of second bond pads to the second portion of the first die in the first cavity; and
attaching each of one or more second bond wires to one of the first bond pads of the first die and to one of the second bond pads of the second die,
providing a second leadframe, comprising:
a second die pad, and
a plurality of second leads,
wherein providing the second leadframe comprises providing a leadframe array comprising the first leadframe and the second leadframe;
attaching a third die to the second die pad of the second leadframe of the leadframe array;
with third bond wires, electrically connecting the third die to the second leads of the second leadframe;
forming a second molded package body by molding the molding compound over each of:
a portion of the second die pads of the second leadframe,
a portion of the second leads of the second leadframe,
a first portion of the third die, and
one or more of the third bond wires,
wherein the second molded package body partially defines a second cavity, wherein a second portion of the third die contacts neither of the second die pad and the second molded package body;

attaching a fourth die comprising a plurality of fourth bond pads to the second portion of the third die in the second cavity; and with fourth bond wires, electrically connecting the fourth die to the third die.

10. The method of claim 9, further comprising adding a gel encapsulant to the first cavity, wherein the gel encapsulant contacts the first die, the second die, and the second bond wires.

11. The method of claim 9, further comprising attaching a lid to the first molded package body, wherein the lid further defines the first cavity.

12. The method of claim 11, wherein the material forming the molding compound is the same as the material forming the lid.

13. The method of claim 11, wherein the lid comprises a hole exposing the first cavity.

14. The method of claim 11, further comprising molding the lid, wherein molding the lid comprises:

placing a copper plate on a chase;

injecting the molding compound into the chase;

removing the molding compound from the copper plate; and curing the molding compound.

15. The method of claim 9, wherein the first molded package body is molded over each of the first bond wires.

16. The method of claim 9, further comprising:

attaching at least one additional die comprising a plurality of additional bond pads to the second die in the first cavity or to another additional die; and attaching each of one or more additional bond wires to the at least one additional die.

17. The method of claim 9, further comprising:

attaching a first lid to the first molded package body, wherein the first lid further defines the first cavity; and attaching a second lid to the second molded package body, wherein the second lid further defines the second cavity.

18. The method of claim 17, wherein the material of the molding compound is the same as the material forming the first and second lids.

19. The method of claim 17, wherein, when respectively attached to the first and second molded package bodies, the first and second lids are mechanically connected as a lid array.

20. The method of claim 19, further comprising molding the lid array, wherein the first lid comprises a first hole and the second lid comprises a second hole, and wherein the first hole is larger than the second hole.

21. The method of claim 9, wherein the first and second leadframes are attached.

* * * * *